United States Patent
Li

(10) Patent No.: US 10,816,894 B2
(45) Date of Patent: Oct. 27, 2020

(54) MASK ASSEMBLY AND LITHOGRAPHY METHOD USING THE SAME

(71) Applicant: Winbond Electronics Corp., Taichung (TW)

(72) Inventor: Cheng-Chiang Li, Taichung (TW)

(73) Assignee: Winbond Electronics Corp., Taichung (TW)

( * ) Notice: Subject to any disclaimer, the term of this patent is extended or adjusted under 35 U.S.C. 154(b) by 336 days.

(21) Appl. No.: 16/014,602

(22) Filed: Jun. 21, 2018

(65) Prior Publication Data

US 2018/0373139 A1 Dec. 27, 2018

(30) Foreign Application Priority Data

Jun. 22, 2017 (CN) .......................... 2017 1 0479134

(51) Int. Cl.
*G03F 1/70* (2012.01)
*G03F 7/20* (2006.01)
*G03F 1/42* (2012.01)
*H03F 1/36* (2006.01)
*H01L 21/768* (2006.01)
*G03F 1/36* (2012.01)

(52) U.S. Cl.
CPC ............ *G03F 1/70* (2013.01); *G03F 7/70466* (2013.01); *G03F 1/36* (2013.01); *G03F 1/42* (2013.01); *H01L 21/76816* (2013.01)

(58) Field of Classification Search
CPC ..... G03F 1/36; G03F 1/42; G03F 1/70; G03F 7/70466
USPC ............................................... 430/5, 22, 312
See application file for complete search history.

(56) References Cited

U.S. PATENT DOCUMENTS 7,776,750 B2    8/2010   Kim

FOREIGN PATENT DOCUMENTS

TW              457548 B       10/2001
TW           200828409 A        7/2008
TW            I1460534 A       11/2014

*Primary Examiner* — Christopher G Young
(74) *Attorney, Agent, or Firm* — Muncy, Geissler, Olds & Lowe, P.C.

(57) ABSTRACT

A mask assembly includes a first mask having a plurality of first stripe patterns, the first stripe patterns extend in a first direction. The mask assembly also includes a second mask having a plurality of second stripe patterns. The second stripe patterns extend in a second direction. The second direction is different from the first direction. When the first mask and the second mask are overlaid to double-expose the same photoresist layer, a staggered pattern is formed at an overlay region of the first stripe patterns and the second stripe patterns.

14 Claims, 19 Drawing Sheets

106'
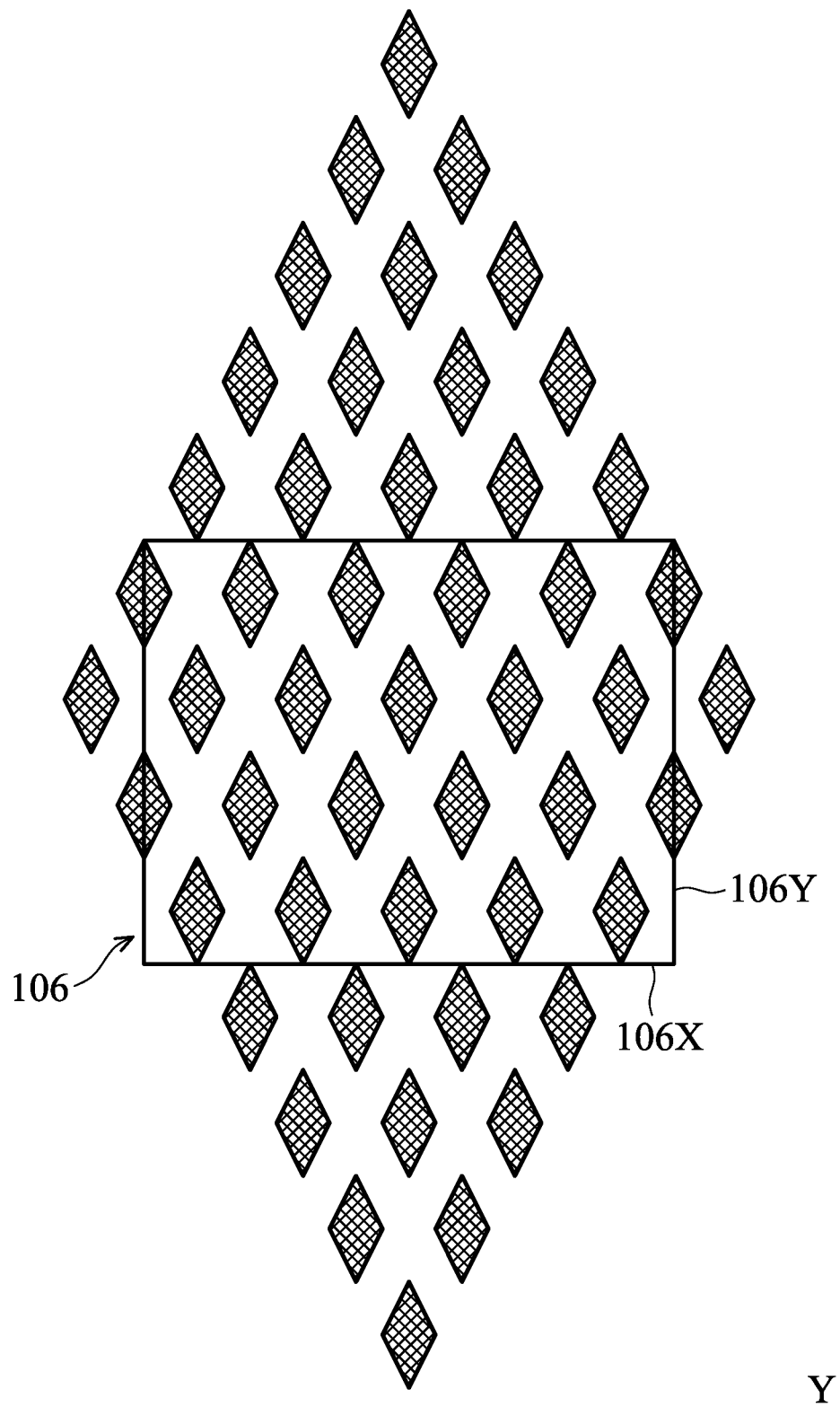
FIG. 1D(II)

206

208  208X  208E

E                                              E'

306a

308a

402a

402aY

402aX

402aD 400a  404a  402a

406a

408a

MASK ASSEMBLY AND LITHOGRAPHY METHOD USING THE SAME

CROSS REFERENCE TO RELATED APPLICATIONS

This Application claims priority of China Patent Application No. 201710479134.X, filed on Jun. 22, 2017, the entirety of which is incorporated by reference herein.

BACKGROUND

Technical Field

The disclosure relates to a lithography technology and more particularly to a mask assembly for double exposure and the lithography method.

Description of the Related Art

The semiconductor integrated circuit (IC) industry has experienced rapid growth. Technological advances in IC design and materials have produced generations of ICs. Every generation has smaller and more complex circuits than the last generation. In the process of IC development, the geometry size has shrunk gradually.

The lithography technology is the key to keep semiconductor sizes shrinking. As the industry continues developing, there are many different ways to use, for example, Double Exposure (DE), Litho-Etching-Litho-Etching (LELE), Extreme Ultraviolet Lithography (EUVL), Self-Alignment Double Patterning (SADP), Negative Tone Development (NTD), and Directed Self-Assembly (DSA), etc.

Currently the power source of Extreme Ultraviolet Lithography is not good enough for mass production and the materials for Directed Self-Assembly are still in development. Therefore, current pattern shrinkage relies on multi-patterning techniques, and double exposure is an effective process technique to shrink contact holes. In general, a good mask pattern design may improve the process window.

Although existing double exposure technologies have generally been adequate for their intended purposes, they have not been entirely satisfactory in all respects and need to be improved, especially with respect to the mask pattern design.

BRIEF SUMMARY

The present disclosure provides a mask assembly that includes a first mask having a plurality of first stripe patterns. The first stripe patterns extend in a first direction. The mask assembly also includes a second mask having a plurality of second stripe patterns. The second stripe patterns extend in a second direction. The second direction is different from the first direction. When the first mask and the second mask are overlaid to double-expose the same photoresist layer, a staggered pattern is formed at an overlay region of the first stripe patterns and the second stripe patterns.

The present disclosure also provides a lithography method that includes providing the above-mentioned mask assembly. The lithography method also includes providing a substrate. The lithography method also includes exposing a photoresist layer by the first mask to form the first stripe patterns on the substrate. The lithography method also includes exposing the photoresist layer by the second mask to form the second stripe patterns on the substrate. The lithography method also includes developing the photoresist layer and leaving a photoresist layer which has been exposed at least once.

BRIEF DESCRIPTION OF DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion

DETAILED DESCRIPTION

Figure 1A:
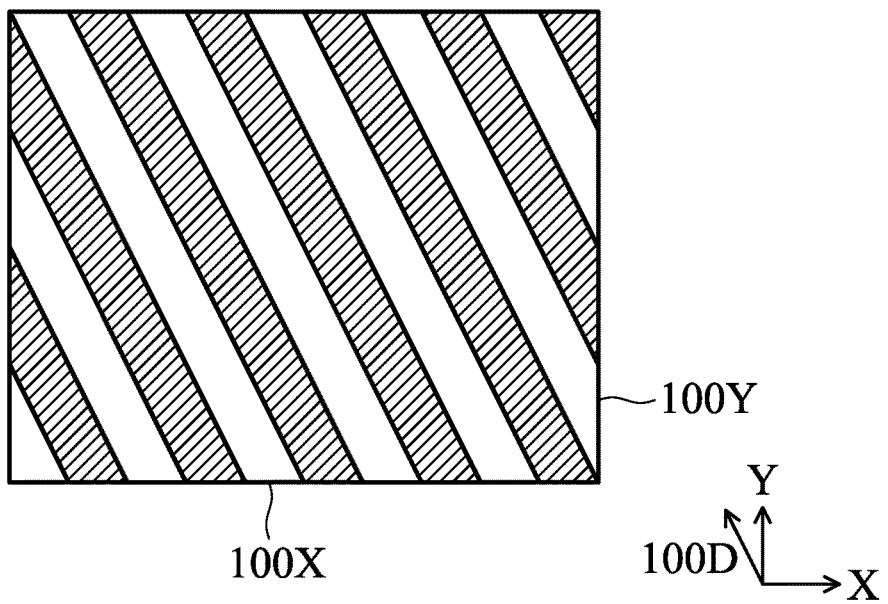
FIG. 1A and FIG. 1B are top views of two masks in a mask assembly in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Herein, the terms "around," "about," "substantial" usually mean within 20% of a given value or range, preferably within 10%, and better within 5%, or 3%, or 2%, or 1%, or 0.5%. The term "substantially perpendicular" usually means that the angle is between 90±10°, preferably 90°±5°. It should be noted that the quantity herein is a substantial quantity, which means that the meaning of "around," "about," "substantial" are still implied even without specific mention of the terms "around," "about," "substantial."

The embodiments of the present disclosure provide that the mask patterns of a mask assembly are modified. After two masks are overlaid for double exposure and etching, staggered array of holes or pillars are formed. The staggered array of holes described above may be used for forming contact holes. The cross-sectional area of a circular contact hole is greater, and therefore the contact resistance of that is lower. With lower contact resistance, the product performance may be enhanced.

Figure 1B:
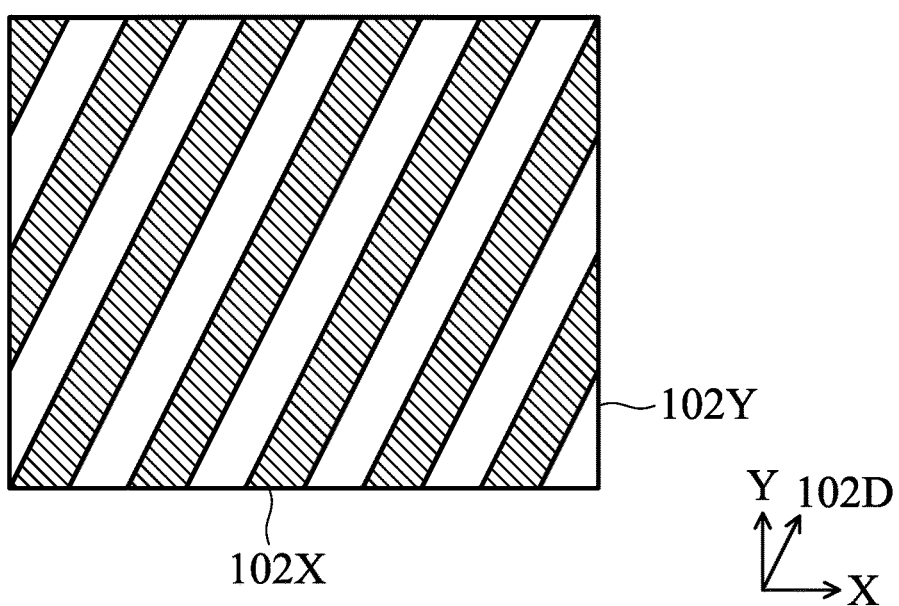
Figure 1C:
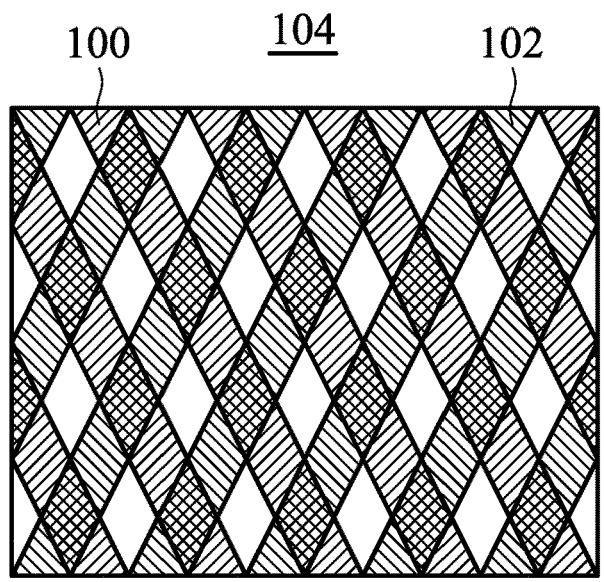
FIG. 1C is the overlay pattern of the two masks in FIG. 1A and FIG. 1B.
Figure 1D:
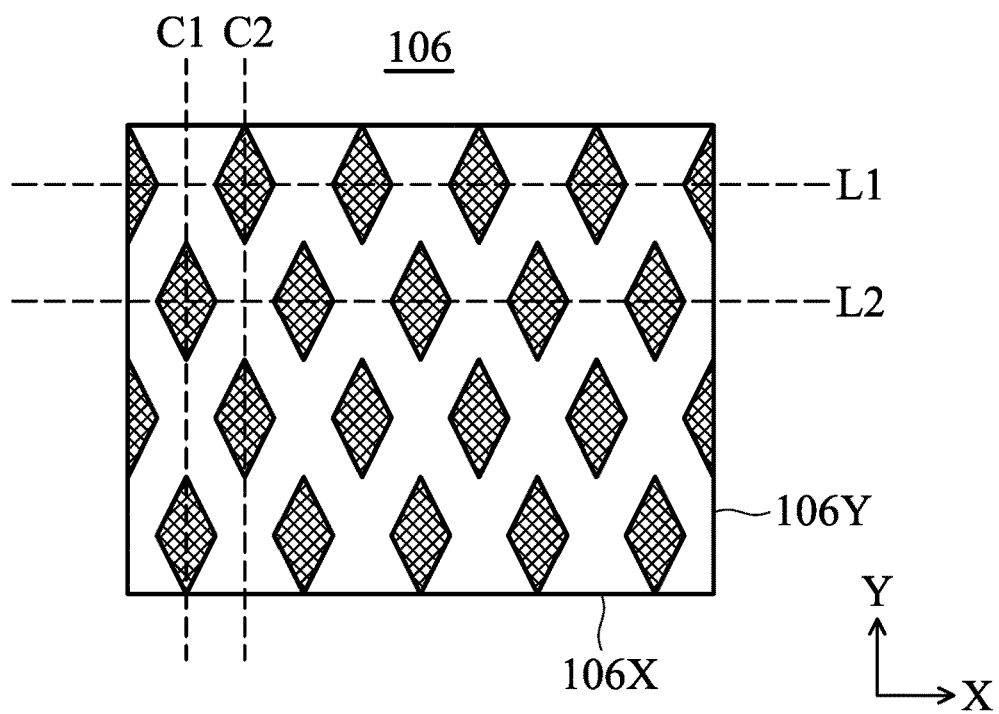
FIG. 1D (I) and FIG. 1D (II) are the patterns of the overlay region of the two masks in FIG. 1A and FIG. 1B.

FIG. 1A and FIG. 1B is a mask assembly formed by a mask pattern 100 and a mask pattern 102 respectively in accordance with some embodiments. The mask pattern 100 and the mask pattern 102 include a plurality of parallel stripe patterns respectively. The extension directions 100D and 102D of the parallel stripe patterns of the two masks are not parallel to either frame of the masks (that is, the frames 100X and 102X along the X direction, and the frames 100Y and 102Y along the Y direction). The two extension directions 100D and 102D are not perpendicular to each other. FIG. 1C is the overlay pattern 104 of the mask pattern 100 and the mask pattern 102. FIG. 1D shows the pattern 106 of the overlay regions of the mask pattern 100 and the mask pattern 102. In other words, the overlay region has never been exposed. As shown in the figures, the mask overlay region pattern 106 is a staggered array pattern consisting of diamonds.

As shown in FIG. 1D (I), here "staggered" means for example the patterns on the first line L1 and that on the second line L2 are not aligned in the X direction. Similarly, the patterns on the first column C1 and that on the second column C2 are not aligned in the Y direction, either.

As shown in FIG. 1D (II) according to some embodiments, the mask pattern 100 and the mask pattern 102 are a plurality of parallel stripe patterns. The overlay region 106' of their extension is a staggered array pattern consisting of diamonds. However, the direction of the boundary of the staggered array pattern is not parallel to the mask frame. For the sake of subsequent processes and measurement steps, in FIG. 1D (I) only partially staggered array pattern (i.e. mask overlay region pattern 106) is taken, making the direction of the boundary of the staggered array pattern parallel to the mask frame 106X (along the X direction) and the mask frame 106Y (along the Y direction).

Figure 1E:
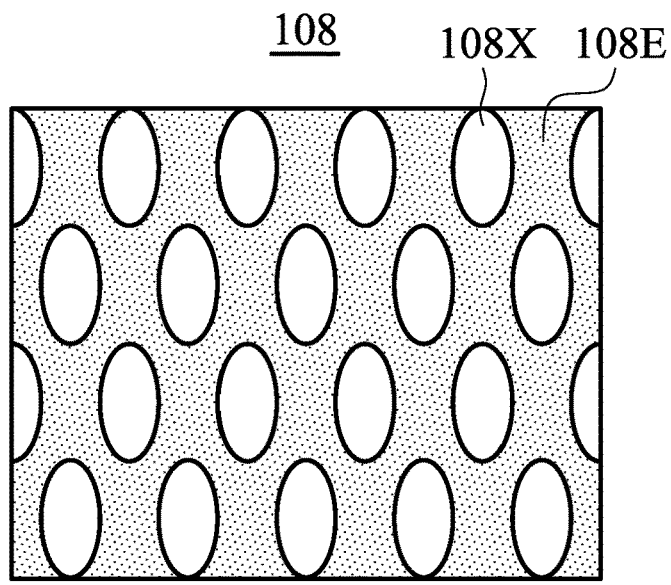
FIG. 1E is the photoresist pattern after double exposure and development by the two masks in FIG. 1A and FIG. 1B.

FIG. 1E is the photoresist pattern 108 of a photoresist layer after double exposure and development by the mask pattern 100 and the mask pattern 102 according to some embodiments. The photoresist pattern 108E is the photoresist pattern that has been exposed at least once, and the photoresist pattern 108X is the photoresist pattern that has never been exposed. As shown in the figure, the photoresist pattern 108X is a staggered array pattern consisting of ellipses.

Since the extension directions 100D and 102D of the parallel stripe patterns of the mask pattern 100 and mask pattern 102 are not perpendicular to each other, the mask overlay region pattern 106 is a plurality of staggered array patterns consisting of diamonds. Due to the limitation of optical diffraction, and the process effect such as the post exposure bake (PEB) diffusion, the edges of the patterns suffer corner rounding effect during the exposure process. After the exposure process, elliptical patterns are formed from the diamond patterns on the photoresist, and elliptical holes or pillars are formed after the etching process.

Non-orthogonal parallel stripe patterns may give more flexibility for mask design to achieve desired staggered array patterns. However, the area of an elliptical hole is smaller than that of a circular hole, resulting in a greater contact resistance.

Figure 2A:
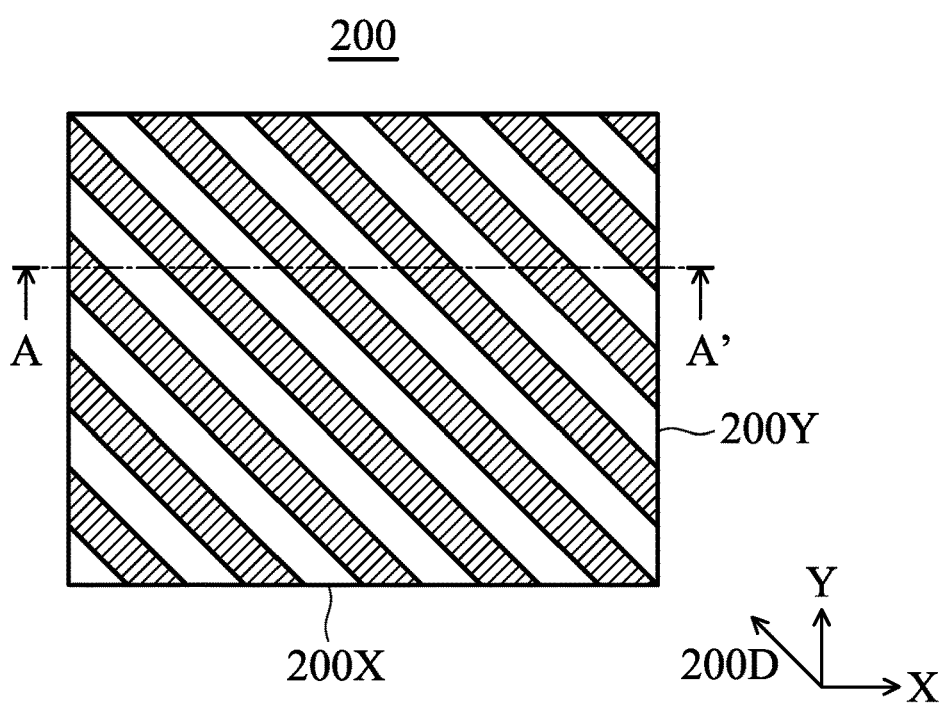
FIG. 2A and FIG. 2B are top views of two masks in a mask assembly in accordance with some embodiments.
Figure 2B:
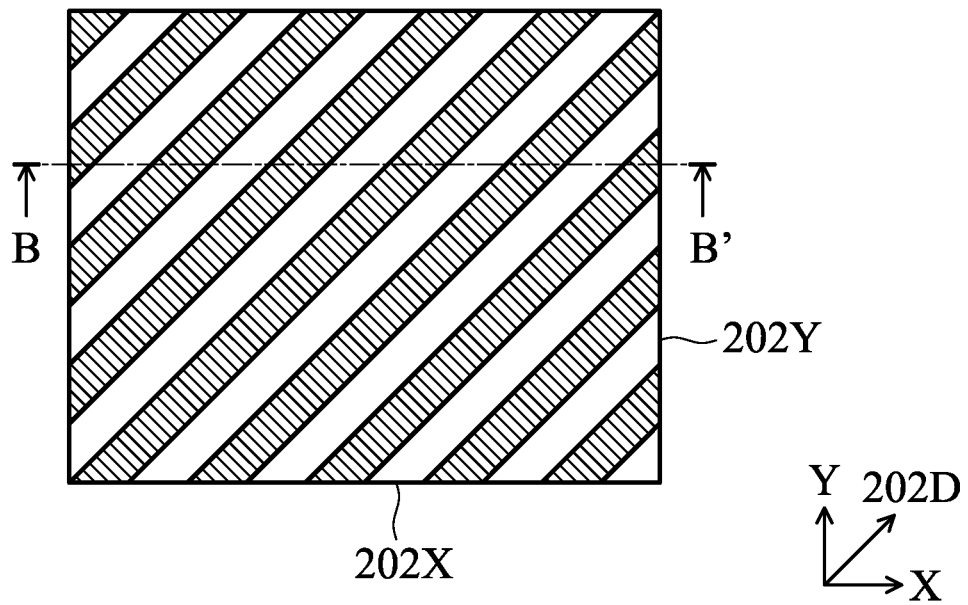
Figure 2C:
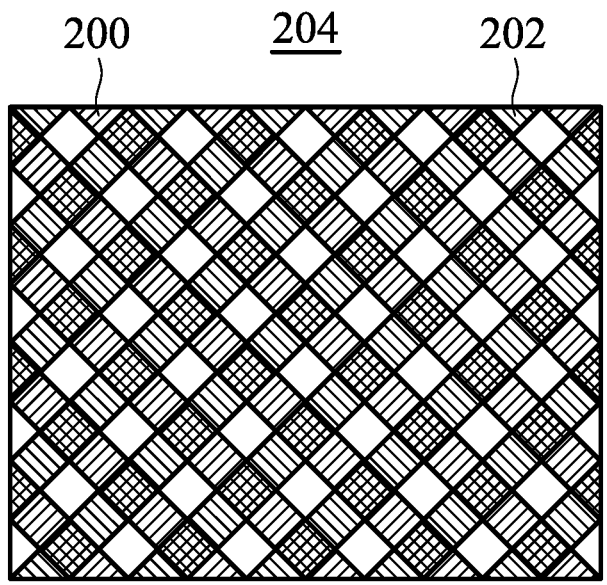
FIG. 2C is the overlay pattern of the two masks in FIG. 2A and FIG. 2B.
Figure 2D:
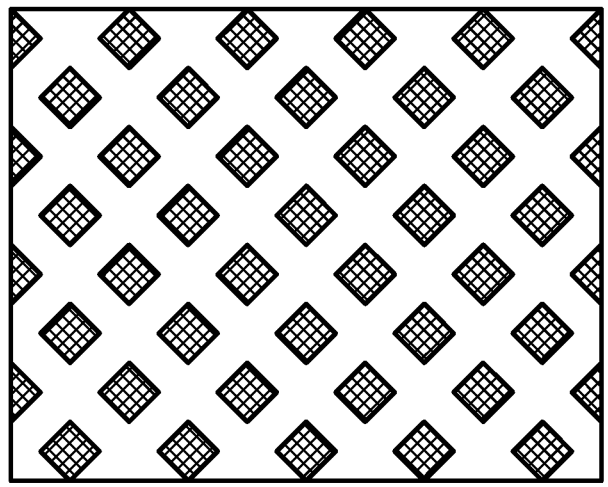
FIG. 2D is the pattern of the overlay region of the two masks in FIG. 2A and FIG. 2B.

FIG. 2A and FIG. 2B is a mask assembly formed by a mask pattern 200 and a mask pattern 202 respectively in accordance with some embodiments. The mask pattern 200 and the mask pattern 202 include a plurality of parallel stripe patterns respectively. The extension directions 200D and 202D of the parallel stripe patterns of the two masks are not parallel to either frame of the masks (that is, the frames 200X and 202X along the X direction, and the frames 200Y and 202Y along the Y direction). The two extension directions 200D and 202D are substantially perpendicular to each other. FIG. 2C is the overlay pattern 204 of the mask pattern 200 and the mask pattern 202. FIG. 2D shows the pattern 206 of the overlay region of the mask pattern 200 and the mask pattern 202. In other words, the overlay region has never been exposed. As shown in the figures, the mask overlay region pattern 206 is a staggered array pattern consisting of squares.

Figure 2E:
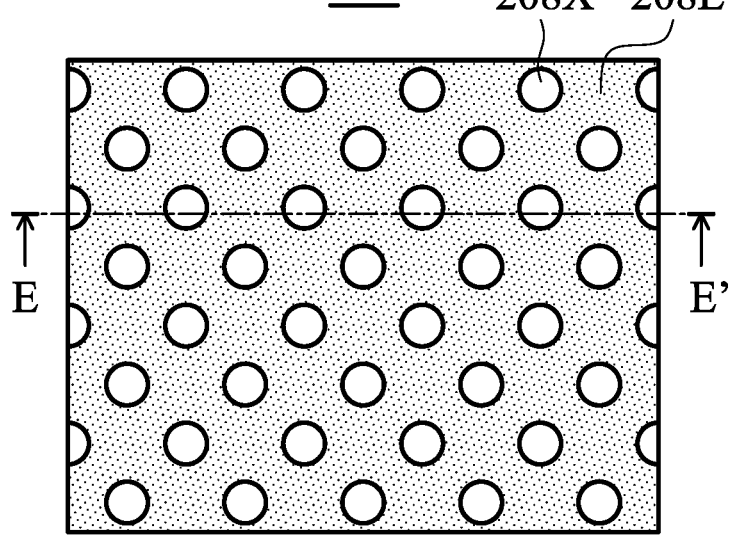
FIG. 2E is the photoresist pattern after double exposure and development by the two masks in FIG. 2A and FIG. 2B.

FIG. 2E is the photoresist pattern 208 of a photoresist layer after double exposure and development by the mask pattern 200 and the mask pattern 202 according to some embodiments. The photoresist pattern 208E is the photoresist pattern that has been exposed at least once, and the photoresist pattern 208X is the photoresist pattern that has never been exposed. As shown in the figure, the photoresist pattern 208X is a staggered array pattern consisting of circles.

Since the parallel stripe patterns of the mask pattern 200 and mask pattern 202 are perpendicular to each other, the mask overlay region pattern 206 is a plurality of staggered array pattern consisting of squares. Due to the limitation of optical diffraction, and the process effect such as the post exposure bake (PEB) diffusion, the edges of the patterns suffer corner rounding effect during the exposure process. After the exposure process, circular patterns are formed from the square patterns on the photoresist, and circular holes or pillars are formed after the etching process.

Staggered array pattern are formed by double exposure. The pattern pitch is not limited by the exposure wavelength limit. Since the straight line pattern exposure process is easier than the square pattern exposure process, the staggered array pattern formed by straight line pattern double exposure is more uniform.

Since the extension direction 200D and 202D of the parallel stripe patterns of the mask pattern 200 and the mask pattern 202 are not parallel to either frame of the masks (that is, the frame 200X and 202X along the X direction, and the frame 200Y and 202Y along the Y direction), it is necessary to perform optical proximity correction (OPC) on the pattern around the mask frame to avoid uneven size of the staggered array pattern at the array edge due to uneven exposure and etching environment.

If circular holes are used as contact holes, since the cross-sectional area is greater, and therefore the contact resistance is lower. With lower contact resistance, the product performance may be further enhanced.

Non-orthogonal parallel stripe pattern may give more flexibility for mask design to achieve desired staggered array patterns. If the overlay regions of the overlaid non-orthogonal parallel stripe patterns are modified as squares, an array of plurality of circles are formed after double exposure and development, and circular array of holes are formed after etching to decrease the contact resistance. As a result, it may have the advantages of greater mask design flexibility and lower contact resistance.

Figure 3A:
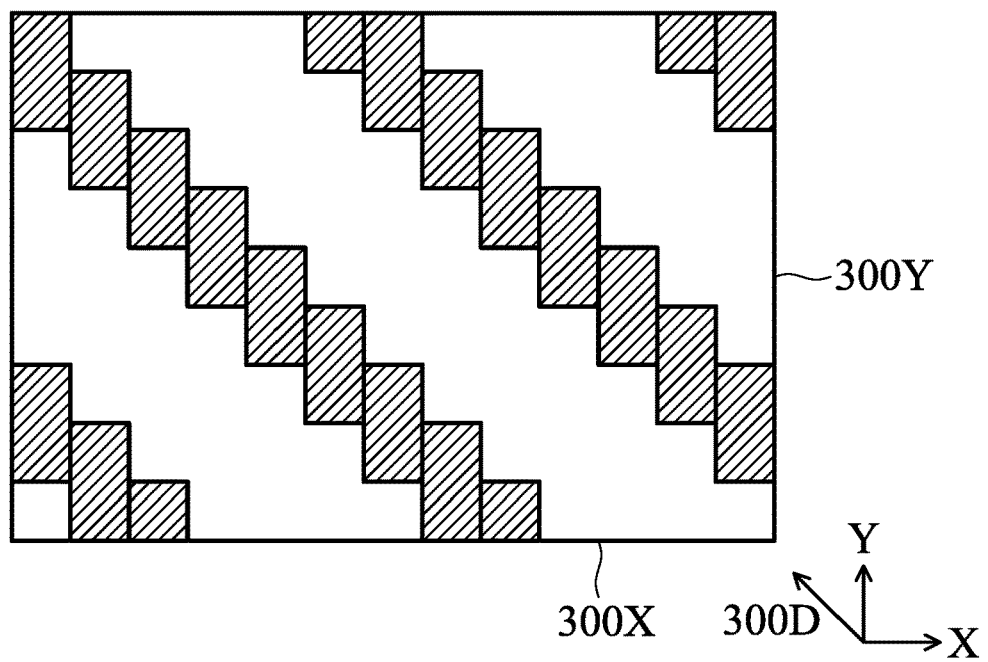
FIG. 3A and FIG. 3B are top views of two masks in a mask assembly in accordance with some embodiments.
Figure 3B:
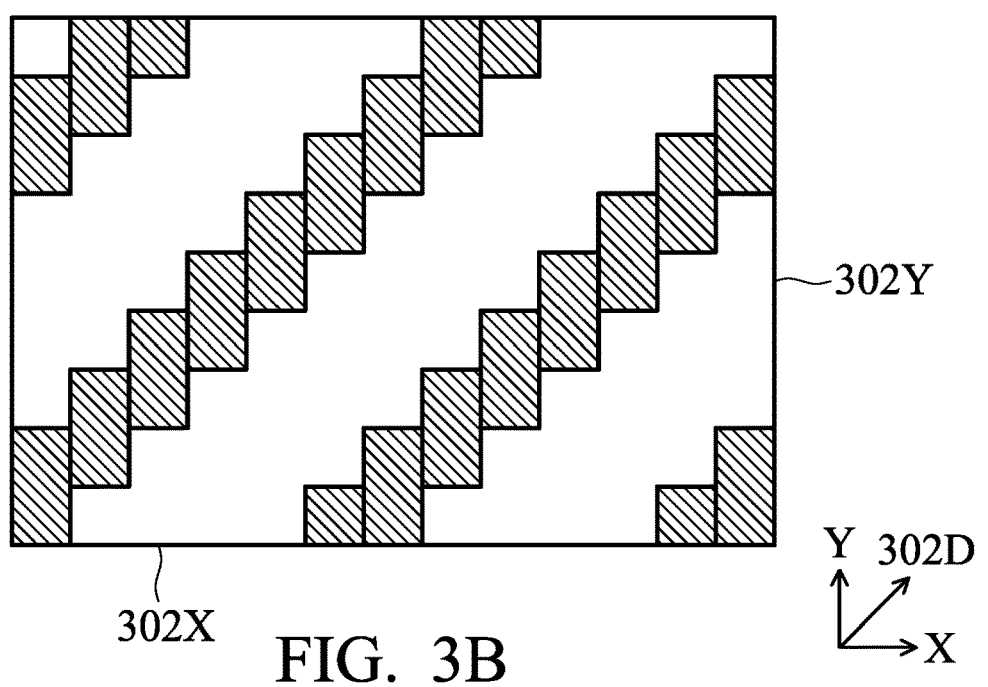
Figure 3C:
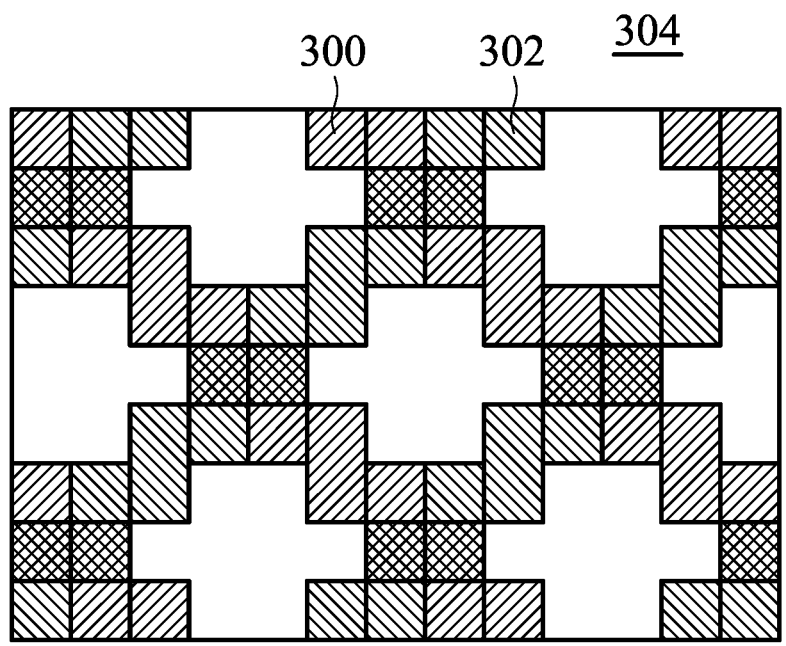
FIG. 3C is the overlay pattern of the two masks in FIG. 3A and FIG. 3B.
Figure 3D:
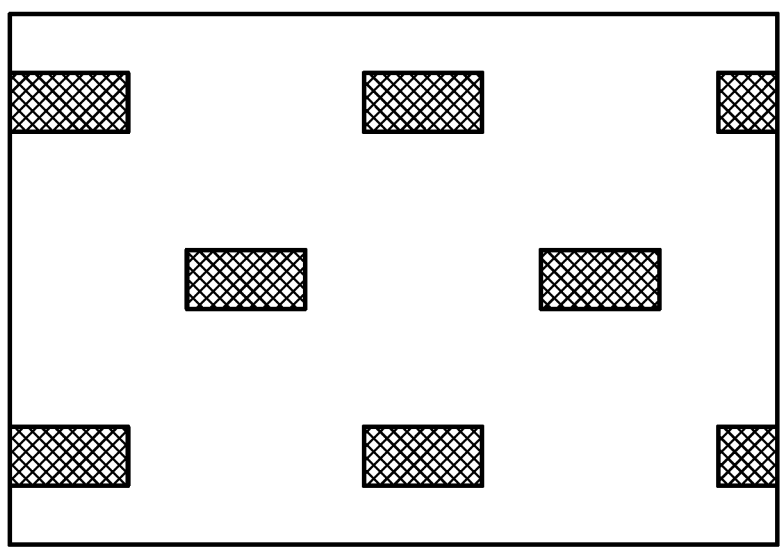
FIG. 3D is the pattern of the overlay region of the two masks in FIG. 3A and FIG. 3B.

FIG. 3A and FIG. 3B is a mask assembly formed by a mask pattern 300 and a mask pattern 302 respectively in accordance with some embodiments. The mask pattern 300 and the mask pattern 302 include a plurality of stair-like stripe patterns respectively. The extension direction 300D and 302D of the stair-like stripe patterns of the two masks are not parallel to either frame of the masks (that is, the frames 300X and 302X along the X direction, and the frames 300Y and 302X along the Y direction). The two extension directions 300D and 302D are substantially perpendicular to each other. FIG. 3C is the overlay pattern 304 of the mask pattern 300 and the mask pattern 302. FIG. 3D shows the pattern 306 of the overlay region of the mask pattern 300 and the mask pattern 302. In other words, the overlay region has never been exposed. As shown in the figures, the mask overlay region pattern 306 is a staggered array pattern consisting of rectangles.

Figure 3E:
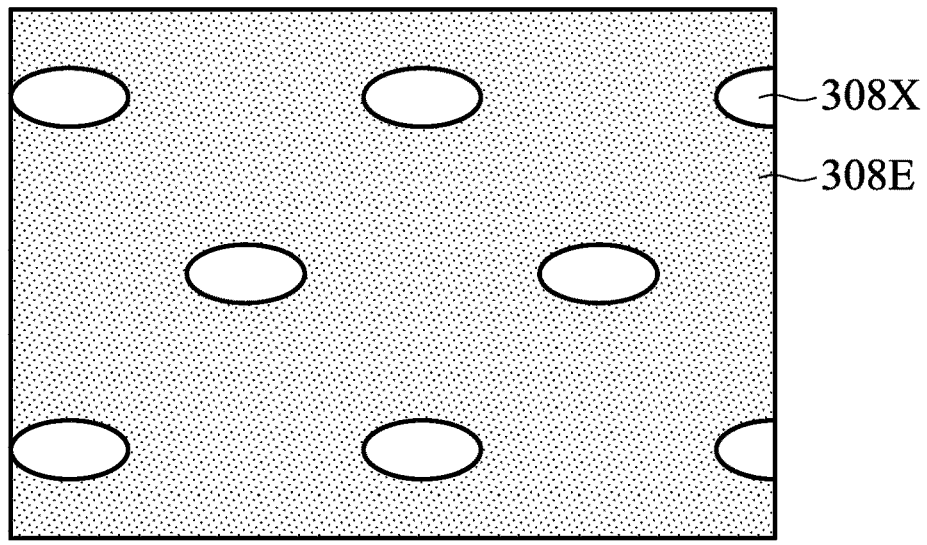
FIG. 3E is the photoresist pattern after double exposure and development by the two masks in FIG. 3A and FIG. 3B.

FIG. 3E is the photoresist pattern 308 of a photoresist layer after double exposure and development by the mask pattern 300 and the mask pattern 302 according to some embodiments. The photoresist pattern 308E is the photoresist pattern that has been exposed at least once, and the photoresist pattern 308X is the photoresist pattern that has never been exposed. As shown in the figure, the photoresist pattern 308X is a staggered array pattern consisting of ellipses.

The mask overlay region pattern 306 is a staggered array pattern consisting of rectangles, and the edges of the patterns suffer corner rounding effect during the exposure process. Therefore, after the exposure process, elliptical patterns are formed from the rectangle patterns on the photoresist, and elliptical holes or pillars, not circular holes or holes, are formed after the etching process.

Since the area of the elliptical hole is smaller than that of a circular hole, the contact resistance is greater. If the overlay region of the overlaid stair-like stripe patterns is modified to be an array of plurality of squares, an array of circular holes is formed after double exposure and etching, and the contact resistance may decrease.

Figure 3F:
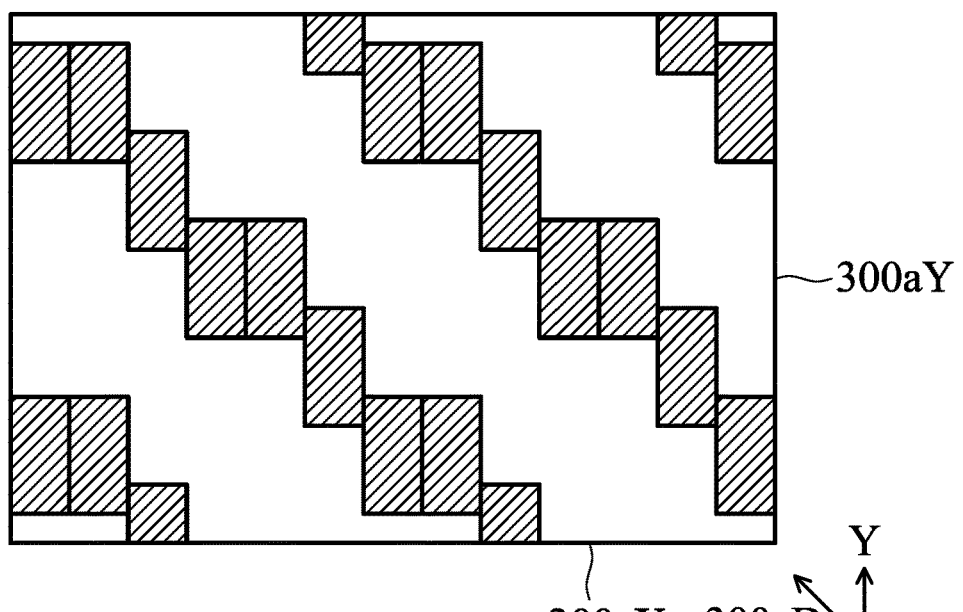
FIG. 3F is the modified mask pattern of that in FIG. 3A.
Figure 3G:
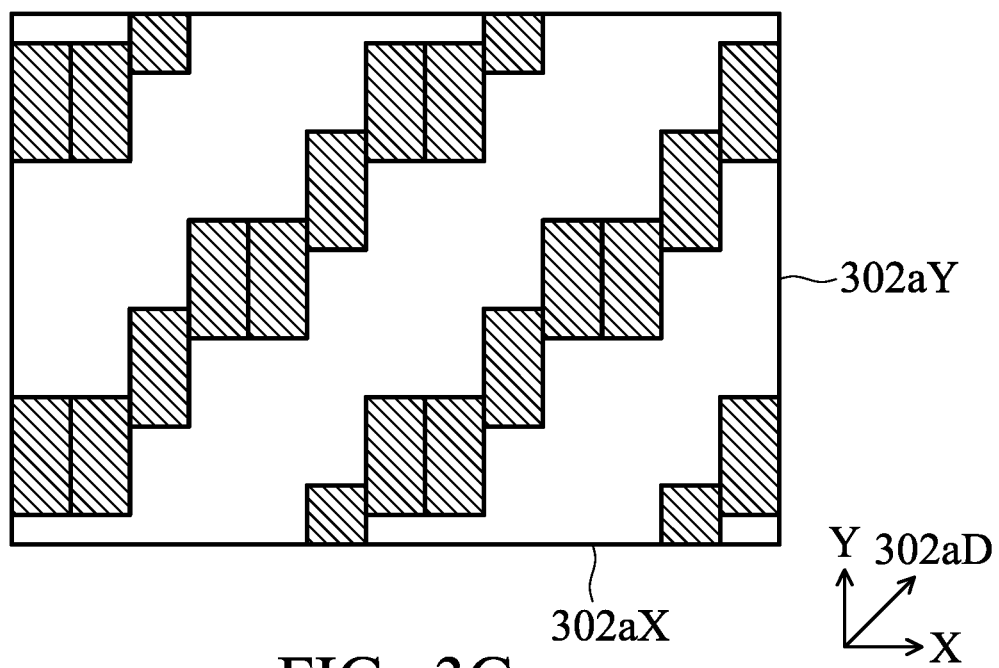
FIG. 3G is the modified mask pattern of that in FIG. 3B.
Figure 3H:
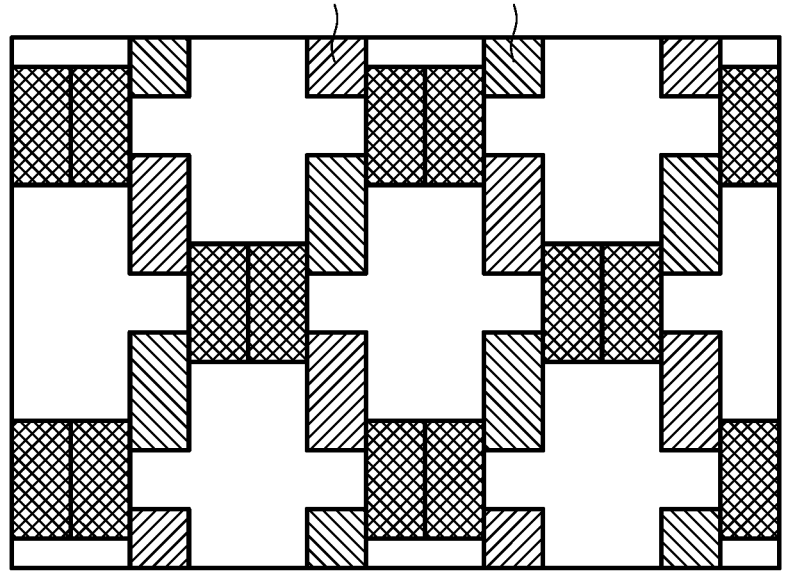
FIG. 3H is the overlay pattern of the two masks in FIG. 3F and FIG. 3G.
Figure 3I:
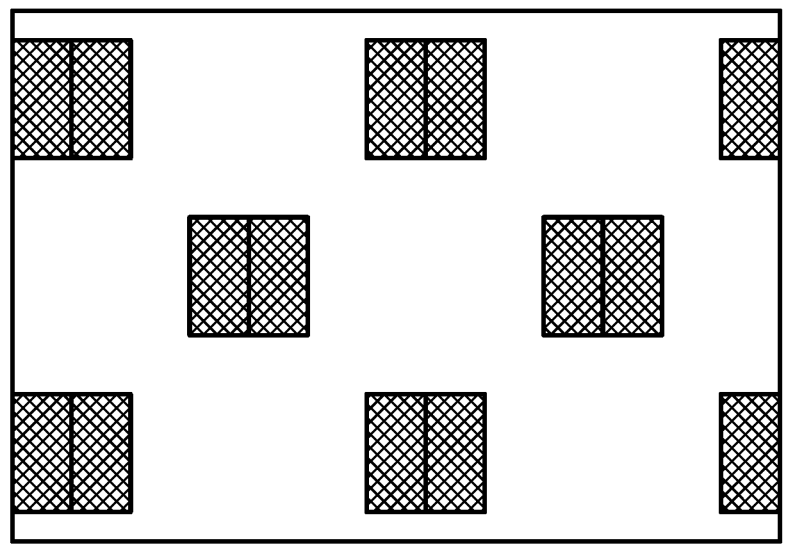
FIG. 3I is the pattern of the overlay region of the two masks in FIG. 3F and FIG. 3G.

FIG. 3F and FIG. 3G is a mask assembly formed by a mask pattern 300a and a mask pattern 302a modified from the mask pattern 300 and the mask pattern 302 respectively in accordance with some embodiments. The mask pattern 300a and the mask pattern 302a include a plurality of at least two abreast same-level stair patterns respectively. The extension directions 300aD and 302aD of the stair-like stripe patterns of the two masks are not parallel to either frame of the masks (that is, the frames 300aX and 302aX along the X direction, and the frames 300aY and 302aY along the Y direction). The two extension directions 300aD and 302aD are substantially perpendicular to each other. FIG. 3H is the overlay pattern 304a of the mask pattern 300a and the mask pattern 302a. FIG. 3I shows the pattern 306a of the overlay region of the mask pattern 300a and the mask pattern 302a. In other words, the overlay region has never been exposed. As shown in the figures, the mask overlay region pattern 306a is a staggered array pattern consisting of squares.

Figure 3J:
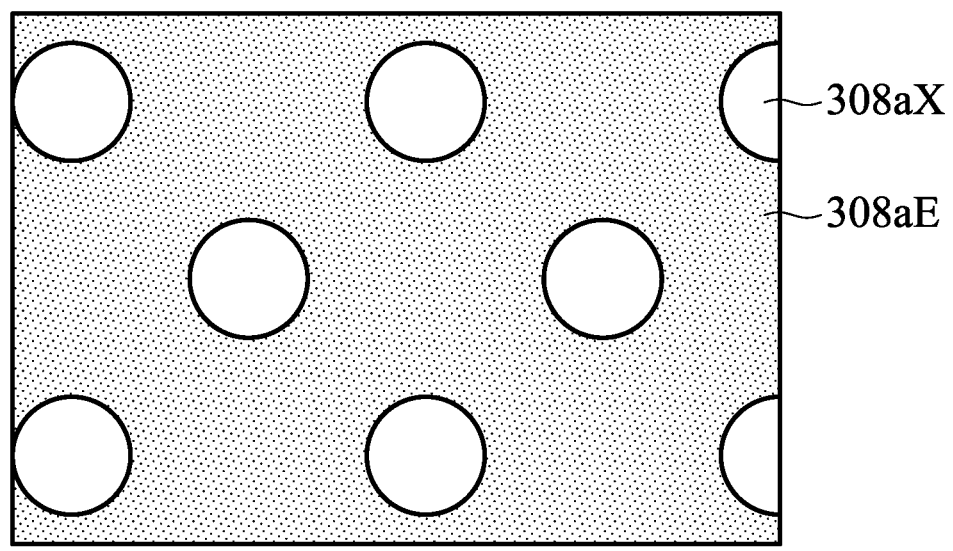
FIG. 3J is the photoresist pattern after double exposure and development by the two masks in FIG. 3F and FIG. 3G.

FIG. 3J is the photoresist pattern 308a of a photoresist layer after double exposure and development by the mask pattern 300a and the mask pattern 302a according to some embodiments. The photoresist pattern 308aE is the photoresist pattern that has been exposed at least once, and the photoresist pattern 308aX is the photoresist pattern that has never been exposed. As shown in the figure, the photoresist pattern 308aX is a staggered array pattern consisting of circles.

Since the stair-like stripe patterns of the mask pattern 300a and the mask pattern 302a include at least two abreast same-level stair patterns, the mask overlay region pattern 306a is a plurality of staggered array pattern consisting of squares. Since the edges of the patterns suffer corner rounding effect during the exposure process, after the exposure process, circular patterns are formed from the square patterns on the photoresist, and circular holes or pillars are formed after the etching process.

As mentioned above, after resolving the parallel stripe patterns into stair-like stripe patterns, by appropriately modifying the position of the stair patterns, such as abreast stairs at the same level, to make the overlay region of the two mask patterns to be substantially squares. An array pattern of circles may be formed after exposure and development, and a circular array holes may be formed after etching. In this way, there may be more flexibility for mask design and more tolerance for optical proximity correction (OPC). Pattern distortion may be suppressed to achieve desired staggered array patterns, and the contact resistance may decrease at the same time.

Figure 4A:
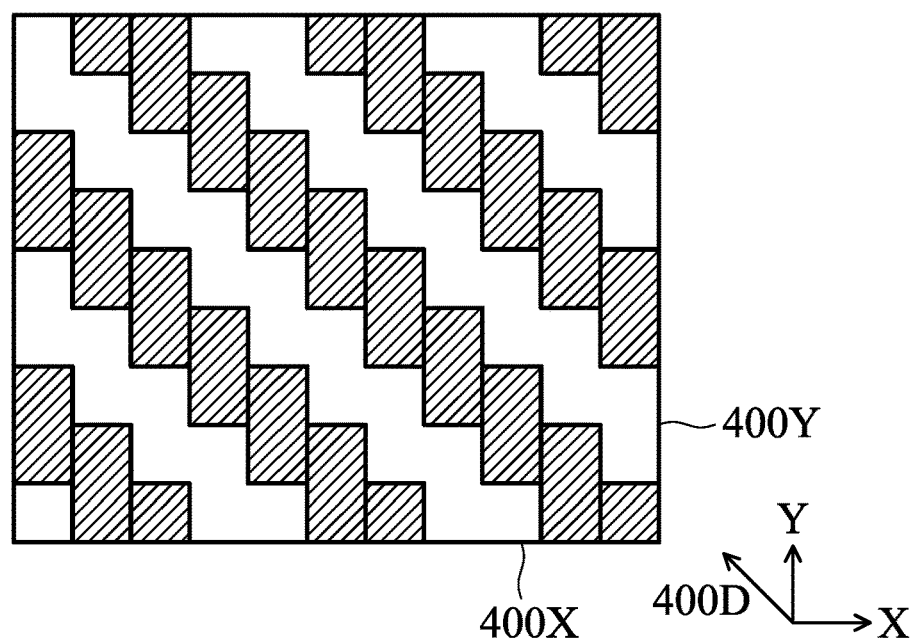
FIG. 4A and FIG. 4B are top views of two masks in a mask assembly in accordance with some embodiments.
Figure 4B:
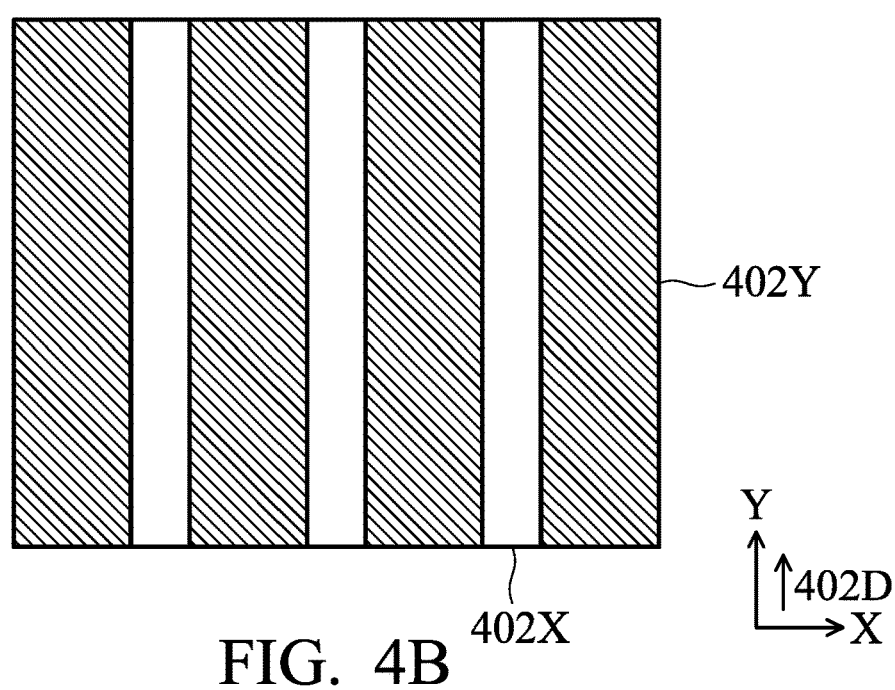
Figure 4C:
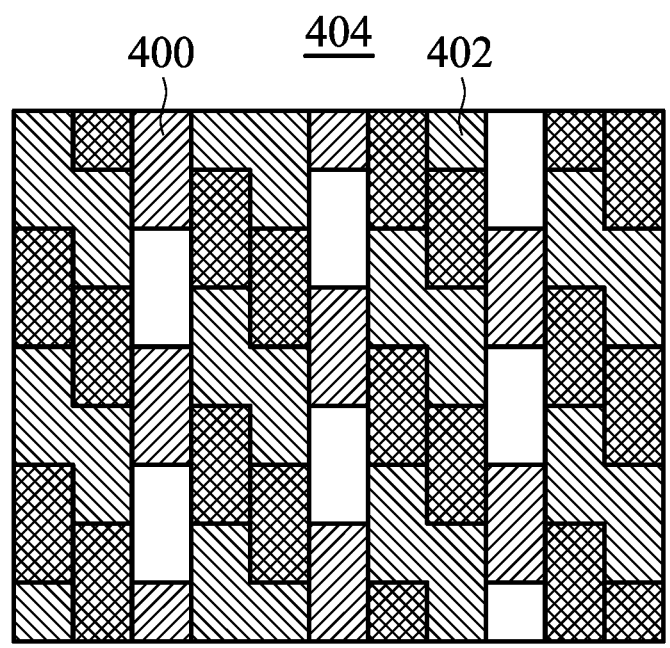
FIG. 4C is the overlay pattern of the two masks in FIG. 4A and FIG. 4B.
Figure 4D:
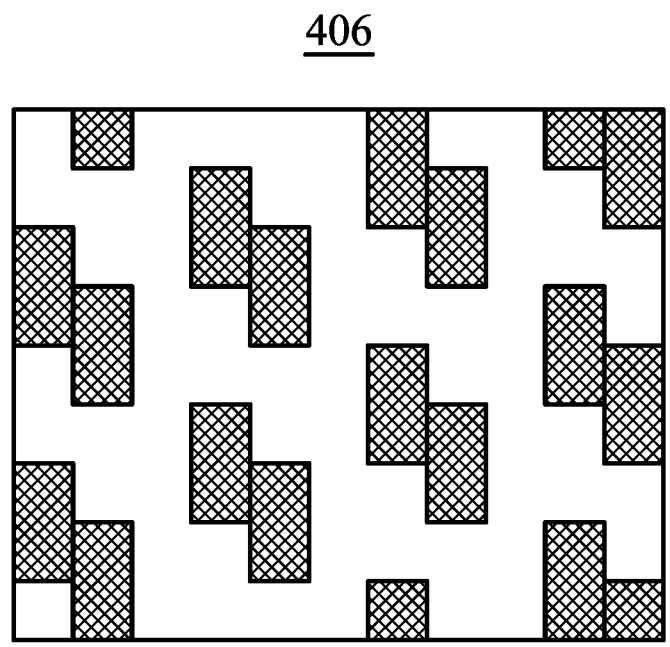
FIG. 4D is the pattern of the overlay region of the two masks in FIG. 4A and FIG. 4B.

FIG. 4A and FIG. 4B is a mask assembly formed by a mask pattern 400 and a mask pattern 402 respectively in accordance with some embodiments. The mask pattern 400 includes a plurality of stair-like stripe patterns. The extension direction 400D of the stair-like stripe patterns of the mask is not parallel to either frame of the mask (that is, the frame 400X along the X direction, and the frame 400Y along the Y direction). The mask pattern 402 includes a plurality of parallel stripe patterns. The extension direction 402D of the mask pattern 402 is parallel to a frame of the mask (the frame 402Y along the Y direction in this embodiment). The two extension directions 400D and 402D of the mask pattern 400 and the mask pattern 402 are not perpendicular to each other. FIG. 4C is the overlay pattern 404 of the mask pattern 400 and the mask pattern 402. FIG. 4D shows the pattern 406 of the overlay region of the mask pattern 400 and the mask pattern 402. In other words, the overlay region has never been exposed. As shown in the figures, the mask overlay region pattern 406 is a staggered array pattern consisting of irregular shapes.

Figure 4E:
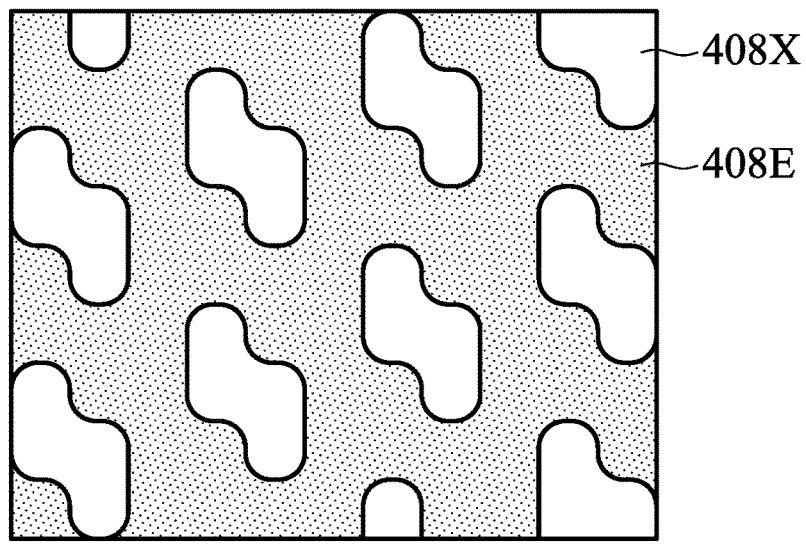
FIG. 4E is the photoresist pattern after double exposure and development by the two masks in FIG. 4A and FIG. 4B.

FIG. 4E is the photoresist pattern 408 of a photoresist layer after double exposure and development by the mask pattern 400 and the mask pattern 402 according to some embodiments. The photoresist pattern 408E is the photoresist pattern that has been exposed at least once, and the photoresist pattern 408X is the photoresist pattern that has never been exposed. As shown in the figure, the photoresist pattern 408X is a staggered array pattern consisting of irregular shapes with rounded corners.

The mask overlay region pattern 406 is a staggered array pattern consisting of a plurality of irregular shapes. Since the edges of the patterns suffer corner rounding effect during the exposure process, after the exposure process, irregular-shapes patterns with rounded corner are formed from the irregular shapes patterns on the photoresist, and irregular-shapes holes or pillars with rounded corner, not circular holes or holes, are formed after the etching process.

Since the area of the irregular-shapes with rounded corner hole is smaller than that of a circular hole, the contact resistance is greater. If the overlay region of the overlaid stair-like stripe patterns is modified to be an array of plurality of squares, an array of circular holes is formed after double exposure and etching, and the contact resistance may decrease.

Figure 4F:
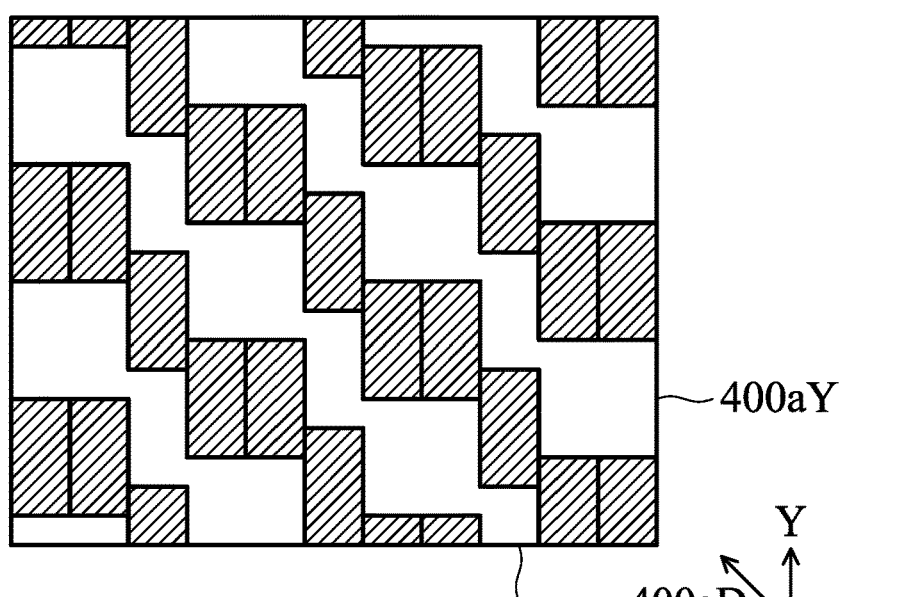
FIG. 4F is the modified mask pattern of that in FIG. 4A.
Figure 4G:
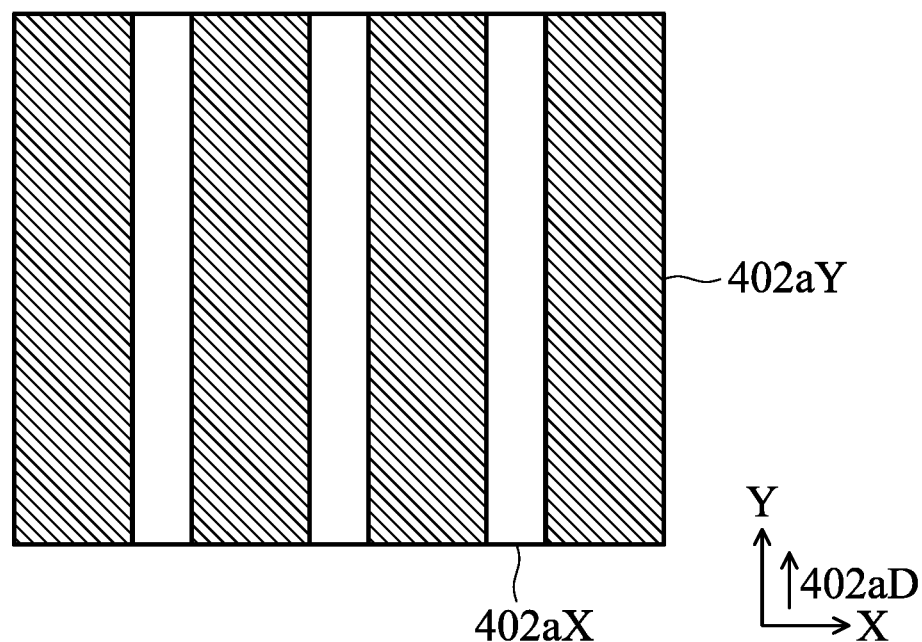
FIG. 4G is the modified mask pattern of that in FIG. 4B.
Figure 4H:
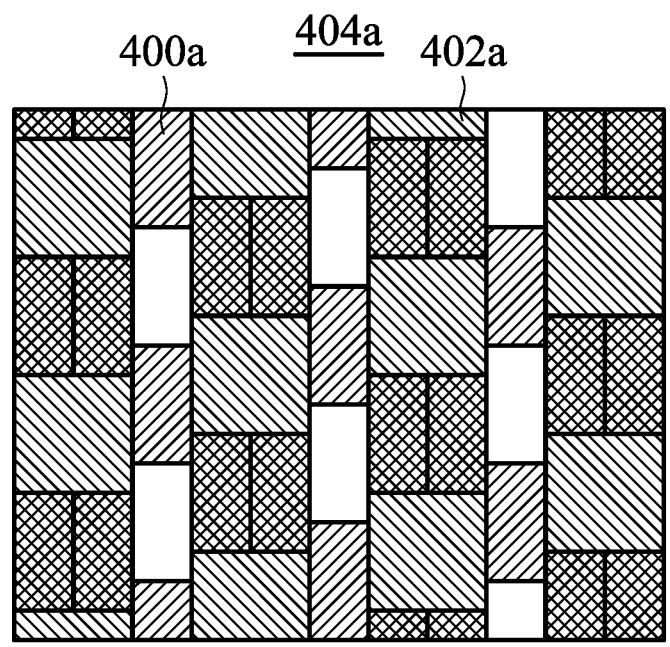
FIG. 4H is the overlay pattern of the two masks in FIG. 4F and FIG. 4G.
Figure 4I:
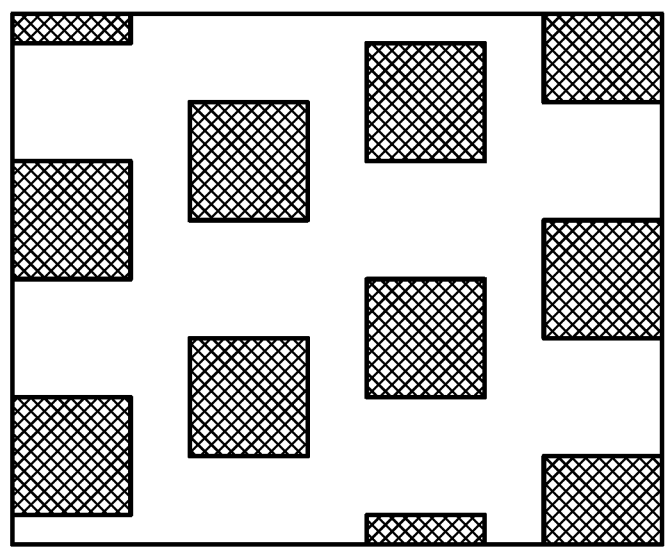
FIG. 4I is the pattern of the overlay region of the two masks in FIG. 4F and FIG. 4G.

FIG. 4F and FIG. 4G is a mask assembly formed by a mask pattern 400a and a mask pattern 402a modified from the mask pattern 400 and the mask pattern 402 respectively in accordance with some embodiments. The mask pattern 400a includes a plurality of at least two abreast same-level stair patterns. The extension direction 400aD of the mask pattern is not parallel to either frame of the masks (that is, the frame 400aX along the X direction, and the frame 400aY along the Y direction). The mask pattern 402a is the same as the mask pattern 402 and has a plurality of parallel stripe patterns. The extension direction 402aD of the mask pattern 402a is parallel to a frame of the mask (the frame 402aY along the Y direction in this embodiment). The two extension directions 400aD and 402aD are not perpendicular to each other. FIG. 4H is the overlay pattern 404a of the mask pattern 400a and the mask pattern 402a. FIG. 4I shows the pattern 406a of the overlay region of the mask pattern 400a and the mask pattern 402a. In other words, the overlay region has never been exposed. As shown in the figures, the mask overlay region pattern 406a is a staggered array pattern consisting of substantially squares.

Figure 4J:
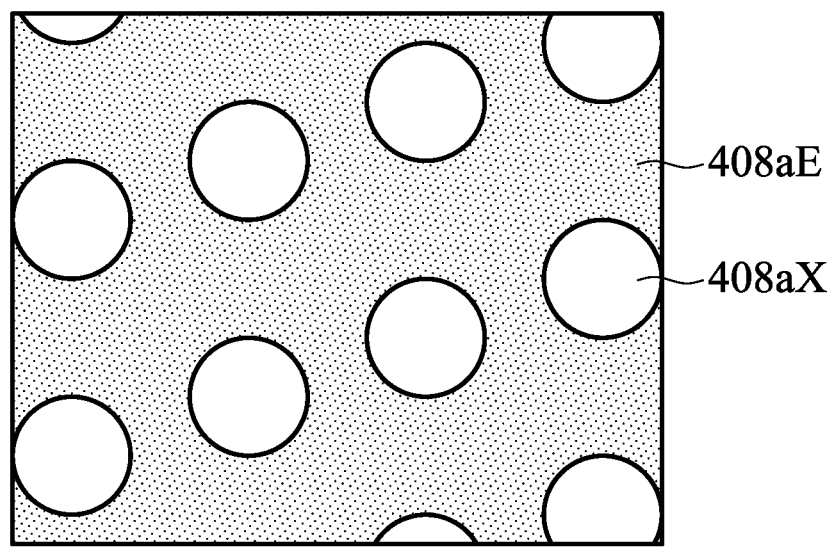
FIG. 4J is the photoresist pattern after double exposure and development by the two masks in FIG. 4F and FIG. 4G.

FIG. 4J is the photoresist pattern 408a of a photoresist layer after double exposure and development by the mask pattern 400a and the mask pattern 402a according to some embodiments. The photoresist pattern 408aE is the photoresist pattern that has been exposed at least once, and the photoresist pattern 408aX is the photoresist pattern that has never been exposed. As shown in the figure, the photoresist pattern 408aX is a staggered array pattern consisting of circles.

Since the stair-like stripe patterns of the mask pattern 400a includes at least two abreast same-level stair patterns, the mask overlay region pattern 406a is a plurality of staggered array pattern consisting of squares. Since the edges of the patterns suffer corner rounding effect during the exposure process, after the exposure process, circular patterns are formed from the square patterns on the photoresist, and circular holes or pillars are formed after the etching process.

It should be noted that in the embodiments of the present disclosure, one of the masks has parallel stripe patterns extending parallel to the Y direction of the mask frame. However, it should not be intended to be limited thereto. In some other embodiments, one of the masks has parallel stripe patterns extending parallel to the X direction of the mask frame.

As mentioned above, if one of the masks has parallel stripe patterns extending parallel to the mask frame, in some embodiments, only one stair-like stripe patterns of the mask pattern needs to be modified. Therefore it may save the time and cost of mask production. Moreover, optical proximity correction (OPC) is needed only on the patterns around two sides of the frame to avoid uneven size of the staggered array pattern at the array edge due to uneven exposure etching environment. The process of the optical proximity correction (OPC) may be greatly simplified.

Moreover, the production cost of the mask with parallel stripe patterns extending parallel to the mask frame may be reduced and the process is easier. Therefore, one of the masks may be made with parallel stripe patterns extending parallel to the mask frame. This may effectively reduce the mask production cost and simplify the process of optical proximity correction (OPC). The desired staggered array patterns may be achieved, and the contact resistance may decrease.

Figure 5:
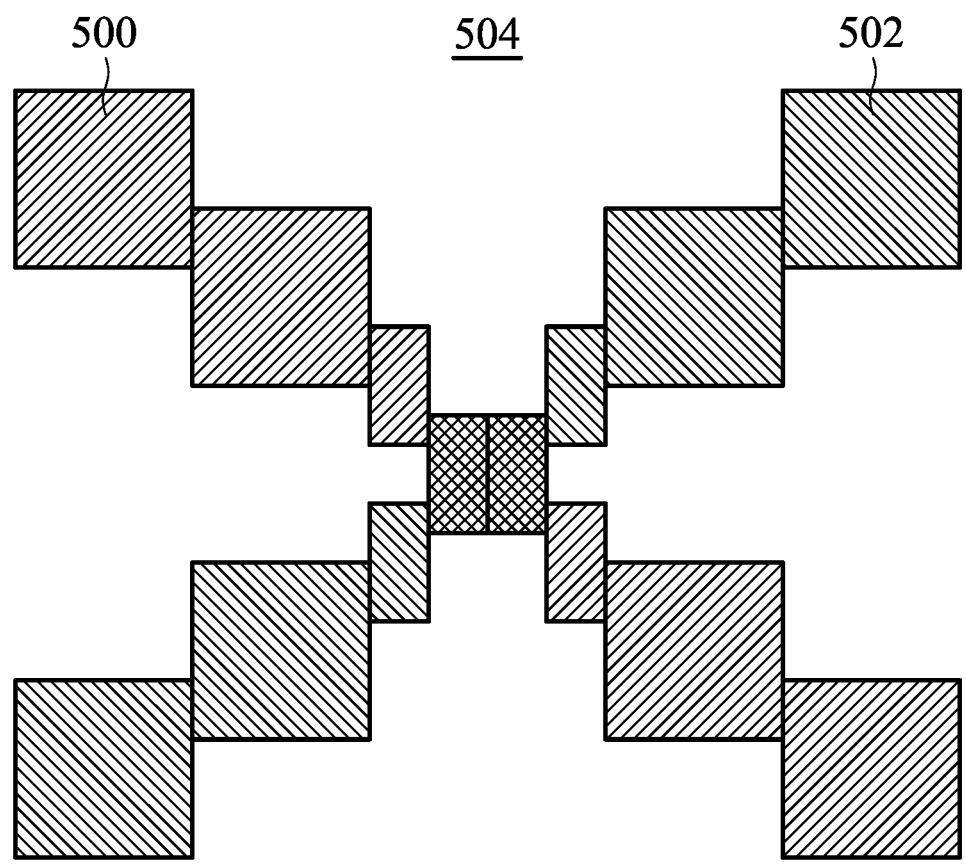
FIG. 5 is the overlay pattern of the two masks with different stair sizes in accordance with some embodiments.

Although in the embodiments described above, the stair size of the stair-like stripe patterns of the mask are all the same. However, in some other embodiments, the stair size of the stair-like stripe patterns of the mask may be different. For example, FIG. 5 is the overlay pattern 504 of the mask pattern 500 and the mask pattern 502. The stair size of the stair-like stripe patterns 500 and 502 are different, To save the mask production time and cost, smaller stair patterns may be resolved only at the overlay region of the two masks, and larger stair patterns may be resolved in other regions. In this way, the mask production cost may be reduced, the desired staggered array pattern may be achieved, and the contact resistance may decrease.

Figure 6A:
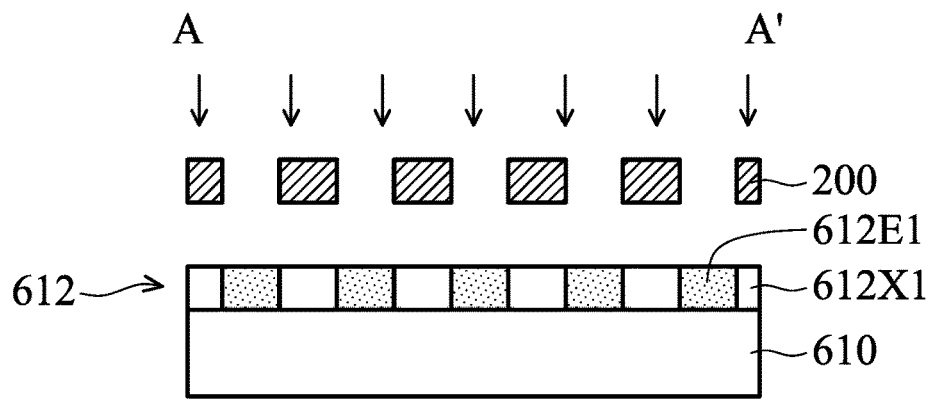
FIGS. 6A-6E shows a lithography method of double exposure by a mask assembly in accordance with some embodiments.
Figure 6B:
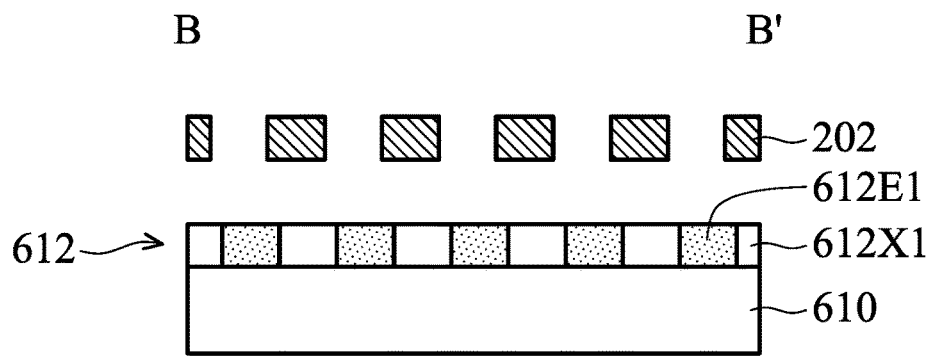
Figure 6C:
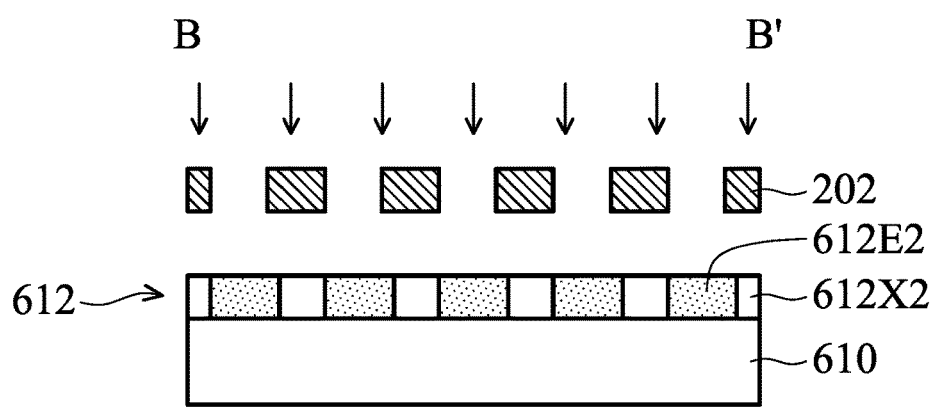

FIGS. 6A-6E are cross-sectional representations in accordance with the embodiments of FIGS. 2A-2E and are used to show a lithography method of double exposure by a mask assembly. FIG. 6A and FIG. 6C use the two mask patterns 200 and 202 in FIG. 2A and FIG. 2B to expose the photoresist respectively.

In this embodiment, the photoresist layer 612 is a negative photoresist. However, in some other embodiments, a positive photoresist or a combination of a positive and a negative photoresist may be used in double exposure and patterning to get staggered array of holes.

As shown in FIG. 6A according to some embodiments, a substrate 610 is provided. The substrate 610 may be a semiconductor wafer, a chip, or a circuit board. The substrate 610 may include semiconductor material such as Si, Ge, InAs, InP, GaAs, or other III-V group compound. The substrate 610 may include structures such as an interconnect structure, an isolation structure, a gate structure, a bit line, a contact plug, a capacitor, etc. The structures of substrate 601 described above are not shown in FIG. 6A for simplicity.

FIG. 6A is the cross-sectional representation along the line AA' in FIG. 2A. As shown in FIG. 6A, using the mask pattern 200 as a mask pattern, the photoresist layer 612 is exposed for the first time. At this time, the photoresist pattern 612E1 in FIG. 6A is an exposed photoresist pattern, and the photoresist pattern 612X1 is an unexposed photoresist pattern.

FIG. 6B is the cross-sectional representation along the line BB' in FIG. 2B. As shown in FIG. 6B, the mask pattern 202 is overlaid on the photoresist layer 612 that has been exposed for the first time.

Next, as shown in FIG. 6C, using the mask pattern 202 as a mask pattern, the same photoresist layer is exposed for the second time. The photoresist layer 612 has been double-exposed. At this time, the photoresist pattern 612E2 in FIG. 6C is a photoresist pattern that has been exposed at least once. The photoresist pattern 612X2 is a photoresist pattern that has never been exposed, which is the overlay region of the mask pattern 200 and the mask pattern 202.

Figure 6D:
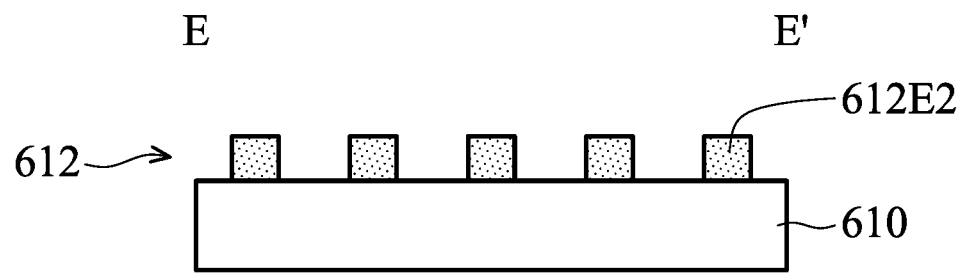

Next, as shown in FIG. 6D, after the photoresist layer 612 is double-exposed by the mask pattern 200 and the mask pattern 202, the photoresist layer 612 is developed. In an embodiment, a negative tone development (NTD) is performed, and the photoresist layer 612E2 which has been exposed at least once is left.

Since the edges of the patterns suffer corner rounding effect during the exposure process, after the exposure process, circular patterns photoresist as shown in FIG. 2E are formed from the square patterns as shown in FIG. 2D on the photoresist. FIG. 6D is the cross-sectional representation along the line EE' in FIG. 2E. As this time, the spacing between the photoresist 612E2 has increased due to corner rounding at the pattern edge.

Figure 6E:
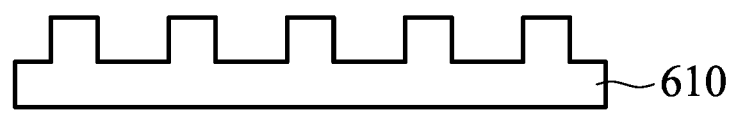

Next, as shown in FIG. 6E, an etching process is performed to etch the substrate 610. After the etching process, a staggered circular array of holes is formed. In this way, there may be more flexibility for mask design to achieve desired staggered array patterns and the contact resistance may also decrease.

The holes described above may be used as the contact holes for Dynamic Random Access Memory (DRAM) and may also be used for non-volatile memory (N \TRAM) or any type of semiconductor devices such as the capacitor region.

It should be noted that in this embodiment the mask pattern 200 is used as a mask pattern to expose first and the mask pattern 202 is used as a mask pattern to expose later. However, the order of the two masks in the present disclosure is not limited thereto. The mask pattern 202 may also be used as a mask pattern to expose first and the mask pattern 200 may be used as a mask pattern to expose later.

As mentioned above, in the embodiment of present disclosure, only two masks are needed to perform a double exposure process to form staggered holes or pillars patterns. By further modifying the mask patterns of the mask assembly, when the two masks are overlaid to expose, the overlay regions are substantially squares. After double exposure and etching, staggered arrays of circular holes or pillars are formed. The staggered array of holes described above may be contact holes. Circular contact holes are with greater cross-sectional area, and therefore are with lower contact resistance. With lower contact resistance, the product performance may be enhanced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A mask assembly, comprising:
a first mask having a plurality of first stripe patterns, wherein the first stripe patterns extend in a first direction; and
a second mask having a plurality of second stripe patterns, wherein the second stripe patterns extend in a second direction, and the second direction is different from the first direction;
wherein when the first mask and the second mask are overlaid to double-expose the same photoresist layer, a staggered pattern is formed at an overlay region of the first stripe patterns and the second stripe patterns, wherein the staggered pattern in adjacent rows and columns are not aligned in a direction of a frame of the first mask or the second mask.

2. The mask assembly as claimed in claim 1, wherein the first direction or the second direction is parallel to a frame of the first mask or the second mask.

3. The mask assembly as claimed in claim 1, wherein the first direction and the second direction are not parallel to a frame of the first mask or the second mask.

4. The mask assembly as claimed in claim 1, wherein the first direction is substantially perpendicular to the second direction.

5. The mask assembly as claimed in claim 1, wherein a border of the staggered pattern is parallel to the frame of the first mask or the second mask.

6. The mask assembly as claimed in claim 1, wherein the overlay region of the first stripe patterns and the second stripe patterns are contact hole patterns.

7. The mask assembly as claimed in claim 1, wherein the overlay region of the first stripe patterns and the second stripe patterns are substantially squares.

8. The mask assembly as claimed in claim 1, wherein the first stripe patterns and the second stripe patterns are like stairs, wherein the first stripe patterns and the second stripe patterns comprise a plurality of at least two abreast same-level stair patterns.

9. The mask assembly as claimed in claim 8, wherein a size of the stair patterns forming the first stripe patterns and a size of the stair patterns forming the second stripe patterns are different.

10. The mask assembly as claimed in claim 8, wherein a size of the stair patterns forming the first stripe patterns and a size of the stair patterns forming the second stripe patterns are the same.

11. The mask assembly as claimed in claim 8, wherein the stair patterns at the overlay region of the first stripe patterns and the second stripe patterns are smaller than the stair patterns not at the overlay region.

12. A lithography method, comprising:
providing a mask assembly as claimed in claim 1;
providing a substrate,
exposing a photoresist layer by the first mask to form the first stripe patterns on the substrate;
exposing the photoresist layer by the second mask to form the second stripe patterns on the substrate;
developing the photoresist layer and leaving a photoresist layer which has been exposed at least once, wherein the staggered pattern in adjacent rows and columns are not aligned in a direction of a frame of the first mask or the second mask.

13. The lithography method as claimed in claim 12, wherein the staggered pattern is a contact hole pattern.

14. The lithography method as claimed in claim 12, wherein the substrate further comprises a plurality of capacitors formed thereon.

\* \* \* \* \*